US010938161B2

(12) United States Patent
Lee et al.

(10) Patent No.: US 10,938,161 B2
(45) Date of Patent: Mar. 2, 2021

(54) SNAP-ON ELECTROMAGNETIC INTERFERENCE (EMI)-SHIELDING WITHOUT MOTHERBOARD GROUND REQUIREMENT

(71) Applicant: Intel Corporation, Santa Clara, CA (US)

(72) Inventors: Jaejin Lee, Beaverton, OR (US); Jun Liao, Portland, OR (US); Xiang Li, Portland, OR (US); Christopher E. Cox, Placerville, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/370,665

(22) Filed: Mar. 29, 2019

(65) Prior Publication Data
US 2019/0229473 A1 Jul. 25, 2019

(51) Int. Cl.
H01R 13/6595 (2011.01)
H01R 13/6581 (2011.01)
(Continued)

(52) U.S. Cl.
CPC ....... *H01R 13/6595* (2013.01); *H01R 12/721* (2013.01); *H01R 13/6581* (2013.01); *H01R 13/6596* (2013.01); *H05K 1/117* (2013.01); *H05K 9/0018* (2013.01); *H05K 9/0024* (2013.01); *H05K 9/0028* (2013.01);
(Continued)

(58) Field of Classification Search
CPC .. H01L 23/552; H05K 9/0033; H05K 1/0216; H05K 1/0218; H05K 2201/10371; H05K 5/0269; H05K 9/0039; H05K 1/0215; H05K 2201/0707; H05K 5/0247; H05K 5/03; H05K 9/0009; H05K 9/0024; H05K 9/0049; H05K 9/0064; H05K 9/0084
See application file for complete search history.

(56) References Cited

U.S. PATENT DOCUMENTS 5,014,160 A * 5/1991 McCoy, Jr. .......... H05K 9/0033
361/818
5,252,782 A * 10/1993 Cantrell ............... H05K 9/0033
174/387

(Continued)

OTHER PUBLICATIONS

Extended European Search Report for Patent Application No. 20158317.6, dated Jun. 16, 2020, 10 pages.

*Primary Examiner* — Edwin A. Leon
*Assistant Examiner* — Matthew T Dzierzynski
(74) *Attorney, Agent, or Firm* — Compass IP Law PC

(57) ABSTRACT

A device includes a printed circuit board (PCB) and a shield for the PCB. The shield can reduce high frequency electromagnetic frequency (EMF) noise generated by one or more components of the PCB. The PCB includes pads to interface with a corresponding connector. For example, for a dual inline memory module (DIMM) PCB, the PCB includes pads to insert into a DIMM connector. The shield includes a gap in its perimeter that aligns with clips in the corresponding connector. The gaps will correspond to similar features of the PCB that interface with the corresponding connector to allow the shield to attach to the PCB. The shield includes lock fingers to extend from a connector-facing edge of the shield to interface with the corresponding connector to align the shield with the corresponding connector.

18 Claims, 10 Drawing Sheets

(51) Int. Cl.
*H05K 9/00* (2006.01)
*H05K 1/11* (2006.01)
*H01R 12/72* (2011.01)
*H01R 13/6596* (2011.01)
*H05K 1/18* (2006.01)

(52) U.S. Cl.
CPC ... *H05K 1/181* (2013.01); *H05K 2201/09163* (2013.01); *H05K 2201/10159* (2013.01)

(56) References Cited

U.S. PATENT DOCUMENTS

| | | |
|---|---|---|
| 5,688,130 A | 11/1997 | Huang |
| 5,949,654 A * | 9/1999 | Fukuoka ............... H01L 21/50 |
| | | 257/700 |
| 5,967,845 A | 10/1999 | Ho et al. |
| 6,152,774 A | 11/2000 | Yu |
| 6,233,150 B1 * | 5/2001 | Lin ..................... H05K 9/0039 |
| | | 165/185 |
| 6,297,966 B1 * | 10/2001 | Lee ..................... H01L 23/552 |
| | | 175/51 |
| 6,343,020 B1 * | 1/2002 | Lin ........................ G11C 5/005 |
| | | 361/753 |
| 6,362,966 B1 * | 3/2002 | Ali ......................... G11C 5/00 |
| | | 174/252 |
| 6,515,871 B1 * | 2/2003 | Stark ..................... H05K 5/026 |
| | | 174/365 |
| 6,890,202 B2 * | 5/2005 | Yasufuku ............... H01R 12/83 |
| | | 439/326 |
| 7,345,892 B2 * | 3/2008 | Imazato .................. G11C 5/04 |
| | | 174/350 |
| 7,609,523 B1 * | 10/2009 | Ni ....................... H01L 23/3672 |
| | | 257/707 |
| 7,768,785 B2 * | 8/2010 | Ni ......................... H01L 23/367 |
| | | 257/707 |
| 10,486,449 B2 * | 11/2019 | Rammah ................. B41M 5/24 |
| 2005/0270758 A1 | 12/2005 | Imazato et al. |
| 2008/0174973 A1 | 7/2008 | Tanaka et al. |
| 2012/0293929 A1 | 11/2012 | Yamaguchi |
| 2013/0337686 A1 | 12/2013 | Wang |
| 2014/0307400 A1 | 10/2014 | French, Jr. |
| 2019/0044289 A1 | 2/2019 | Li et al. |

* cited by examiner

SNAP-ON ELECTROMAGNETIC INTERFERENCE (EMI)-SHIELDING WITHOUT MOTHERBOARD GROUND REQUIREMENT

FIELD

Descriptions are generally related to shielding for radiated electromagnetic interference (EMI), and more particular descriptions are related to as-needed EMI shielding without needing motherboard grounding.

BACKGROUND

Electronic devices with high speed communication create high frequency noise when they operate. The high speed communication on signal lines of a printed circuit board (PCB) causes the signal lines to emit electromagnetic (EM) energy while transmitting the signals. The emission of EM energy results in electromagnetic interference (EMI) based on EM frequency (EMF) noise, where the noise is the emitted signal energy, which can interfere with other signaling.

As an example, dual inline memory modules (DIMMs) include memory devices that perform high speed communication. Typically, DIMMs are populated with double data rate (DDR) memory devices, which is a traditional source of significant radio frequency interference (RFI) because the DDR memory spectrum falls into multiple radio bands and causes significant radio de-sense issues. With increasing memory speed and decreasing system form factor, conventional DDR physical layer designs will lead to severe wireless performance and user experience issues.

Upcoming DDR5 (double data rate version 5) memory technology will support data rates up to 6400 MT/s (mega transfers per second). Thus, the memory bus, 5G-radio, and WiFi communications have similar operating frequencies. Therefore, the potential memory RFI risk will be significant.

Conventional DIMM shielding relies on on-board shields that cover the memory chips themselves, and require mounting to something on the PCB. Implementation of on-board shields is highly limited and influenced by PCB routing. Therefore, there is inconsistent shielding effectiveness, resulting in a significant amount of leakage. Another conventional approach to shielding is a motherboard grounding scheme, where the shield is electrically connected to motherboard ground. Such a scheme typically involves wiring or connectors or connections that increase design complexity and manufacturing complexity.

BRIEF DESCRIPTION OF THE DRAWINGS

The following description includes discussion of figures having illustrations given by way of example of an implementation. The drawings should be understood by way of example, and not by way of limitation. As used herein, references to one or more examples are to be understood as describing a particular feature, structure, or characteristic included in at least one implementation of the invention. Phrases such as "in one example" or "in an alternative example" appearing herein provide examples of implementations of the invention, and do not necessarily all refer to the same implementation. However, they are also not necessarily mutually exclusive.

Figure 1A:
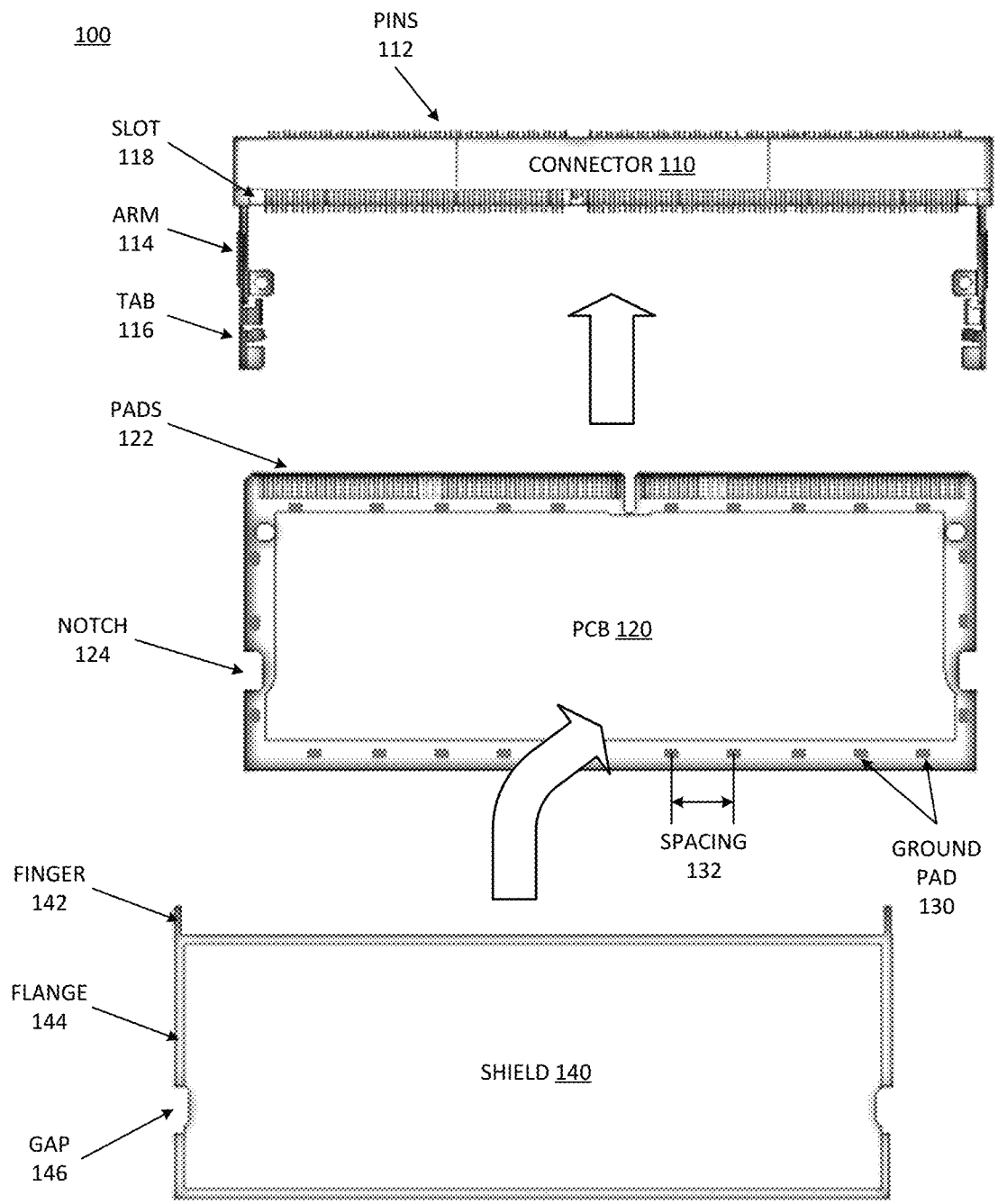
FIG. 1A is a block diagram of an example of a PCB (printed circuit board) without local grounding for a snap on shield.

Descriptions of certain details and implementations follow, including non-limiting descriptions of the figures, which may depict some or all examples, and well as other potential implementations.

DETAILED DESCRIPTION

As described herein, a device includes a printed circuit board (PCB) and a shield for the PCB. The shield can reduce high frequency electromagnetic frequency (EMF) noise generated by one or more components of the PCB. The EMF noise can cause interference in the operation of other system components, especially when the frequency range of the emitted noise is in the same range as the operating frequency of other components. The interference can be referred to as electromagnetic interference (EMI). The shield is grounded to the PCB and reduces the EMI for system components by reducing the amount of noise emitted.

The PCB includes pads to interface with a corresponding connector. The gaps will correspond to similar features of the PCB that interface with the corresponding connector to allow the shield to attach to the PCB. The shield includes lock fingers to extend from the shield past the PCB to interface with the corresponding connector to align the shield with the corresponding connector. For example, for a dual inline memory module (DIMM) PCB, the PCB includes pads to insert into a DIMM connector. In such an implementation a shield for the DIMM can include a gap in its perimeter that aligns with clips in the corresponding DIMM connector. The lock fingers can extend into existing slots in the DIMM connector and provide good noise reduction for the DIMM PCB.

In one example, the shield is removable. The shield can be referred to as a "snap on" shield because it can be connected to the ground on the PCB without requiring a permanent or semi-permanent mounting strategy, such as solder or adhesive/epoxy. The removable or snap on shield can provide as needed shielding. For example, for a given PCB, when shielding is needed the shield can be included and secure into place with features of the shield itself or with features of the corresponding connector, or a combination of features of both. When shielding is not needed for the same given PCB, the PCB can include grounding contacts, but no shield is included.

In addition to EMI shielding, a snap on shield may provide a thermal solution for the PCB. The metal that provides the shielding can also conduct heat away from active components on the board and help dissipate heat. In one example, the snap on shield connects to ground contacts on the PCB, which can be referred to as local ground, and does not need to be connected to the motherboard ground. Connection to the motherboard ground can provide a system ground to ensure a good noise floor for the shielding. Connection to the local ground of the PCB can still provide effective shielding with proper connection to the PCB.

The shield described herein is effective for double data rate (DDR) memory even with the communication frequency generating radio frequency interference (RFI) that falls within the spectrum of multiple radio bands for wireless communication. Applying the shielding described as DIMM shielding reduces radio-interference noise radiation from memory devices. Therefore, it allows a system to maintain reliable wireless performance and good user experience even with smaller form factors and higher communication frequencies.

As described herein, the removable shield is not required to connect to motherboard ground. The lack of needing to connect to motherboard ground can allow system engineers to install the shield on PCBs without board modification or re-spin. In one example, the removable shield can be selectively post-installed on PCBs where RFI risk is present. In one example, the shield can be performed as thermal solution for memory devices on a DIMM. The shield could also be a thermal solution for other components on a PCB that is not for memory devices.

FIG. 1A is a block diagram of an example of a PCB (printed circuit board) without local grounding for a snap on shield. System 100 includes connector 110, PCB 120, and shield 140. PCB 120 represents a circuit board on which active components are mounted (not specifically shown). The PCB represents a circuit that will connect to a motherboard or primary circuit board via connector 110. Connector 110 corresponds with PCB 120 because the connector interconnects the PCB as a system component to a larger system.

The components mounted on PCB 120 generate EMI noise during operation. Without shielding the EMI has the potential to disrupt other components of system 100 that are not shown in FIG. 1, such as communication circuits. Shield 140 reduces the effect of the EMI noise generated by PCB 120.

Connector 110 includes pins 112 to couple to a system-level board to connect to other system components. For example, if PCB 120 is a memory module, pins 112 can connect to a system board where a processor is mounted. If PCB 120 includes a processor, pins 112 can connect to a connection board to couple to peripheral devices. Pads 122 on PCB 120 correspond to pins 112 of connector 110. Pads 122 connect via traces on PCB 120 to components on the PCB. Pins 112 connect those same traces to other system components.

Connector 110 includes arm 114 that extends away from pins 112 and operates to secure PCB 120 to ensure sufficient electrical contact between pads 122 and pins 112. Typically, there will be arms on either side of the connector as illustrated in system 100. At the end of arm 114, connector 110 includes tab 116. Tab 116 represents one or more features that secure PCB 120. Tab 116 can be or include a tab, a clip, a pin, or other mechanism to provide a mechanical interface with PCB 120. Typically, arm 114 aligns PCB 120 to connector 110 and tab 116 secures PCB 120 to the arm, such as by applying spring force to push on PCB 120. In one example, arm 114 includes an alignment tab (not specifically identified), which aligns with notch 124 of PCB 120, while one or more other tabs secure the PCB and shield to connector 110. Tab 116 can be referred to as a retention tab of existing connector arms used to secure PCB 120.

Tab 116 of connector 110 can align with notch 124 of PCB 120. Notch 124 represents a mechanism to align and allow the tab to align with mechanical features of connector 110. Shield 140 covers PCB 120, or more specifically, covers the noise-producing components of PCB 120. Typically, shield 140 only covers one side of PCB 120. Shield 140 includes features to interface with tab 116 and arm 114 of connector 110 to enable the shield to be removably secured to PCB 120 while connected to connector 110.

In one example, shield 140 includes locking fingers represented by finger 142. Finger 142 extends into slot 118 of connector 110. Slot 118 represents a gap or a space between the last of pins 112 and arm 114. Thus, connector 110 includes space where finger 142 can be inserted to provide mechanical stability to the interconnection of shield 140 with connector 110. In one example, shield 140 includes lock fingers 142 and flanges 144. In one example, shield 140 includes clips (not explicitly shown). The clip can be part of shield 140 to clip onto PCB 120 or to clip onto connector 110, or clips both to clip on to PCB 110 and to connector 110.

In one example, shield 140 includes flange 144. As illustrated, flange 144 extends around the entire perimeter of shield 140, except for gaps 146. Gap 146 corresponds with or aligns with notch 124 of PCB 120. In one example, flange 144 slides under or within a feature of arm 114, such as a tab or channel. In one example, flange 144 on the edges corresponding to edges of PCB 120 that will interface with arm 114 allows the flange to have mechanical contact with a channel or tab, and thus the same securing force used to secure PCB 120 can also secure shield 140. Gap 146 can align with notch 124 and thus with a tab or feature of connector 110. For example, arm 114 can include a protruding element that will fit within notch 124 and gap 146. Such a protruding element can provide a spring force towards the sides (the thin sides) of PCB 120. Other tab features of arm 114 can provide a downward force or a top surface of PCB 120 (i.e., the surface seen when looking at the diagram of system 100). The force that pushes or pulls on the top surface of PCB 120 can also push or pull on flange 144 to secure shield 140 to PCB 120.

The straight arrow between PCB 120 and connector 110 represents that PCB 120 is inserted in that direction into connector 110. The curved arrow between shield 140 and PCB 120 represents that shield 140 covers the illustrated surface of PCB 120. The illustrated surface of PCB 120 includes multiple ground pads 130, which could also be referred to as grounding pads. Ground pads 130 have an associated spacing 132. Spacing 132 represents a space between adjacent ground pads 130 along a perimeter of PCB 120. In one example, spacing 132 is less than or equal to one-tenth lambda ($\lambda$), where $\lambda$ represents a wavelength of a center frequency of noise being shielded for. For example, for noise frequency centered around 5 GHz, the wavelength is $\lambda=v/f=3\times10^8/5\times10^9=0.6$ meters, so $\lambda/10$ equals 6 mm.

Ground pads 130 provide an electrical connection to a local ground of PCB 120. The local ground refers to a ground reference for the components mounted on PCB 120. In one example, the ground is provided via one or more ground planes within PCB 120. A ground plane will be understood as one layer of a multiple PCB 120. The ground plane will have certain breaks for signal line routing and vias in the PCB. Thus, a plane is not necessarily exclusively ground conductor on the ground layer, but primarily ground conductor. While the local ground of PCB 120 is typically electrically coupled to the system ground through connector 110, it may float slight off of the system ground. Shield 140 can be connected to the ground of PCB 120 and not need to be connected directly to the system ground, but connect to system ground through connector 110. Traditionally a shield is directly connected to motherboard ground, such as through the use of a screw or other electrical connection that is directly tied to motherboard ground, and requires additional manufacturing to secure the shield. In system 100, shield 140 connects to PCB ground, which then connects to motherboard ground through connector 110.

In one example, shield 140 represents shielding for a dual-in-memory module (DIMM), where PCB 120 represents the memory module board. Shield 140 can reduce RFI risk for client systems. PCB 120 includes ground pads 130 for electrical contact between removable shield and the DIMM. In an example where the DIMM includes memory devices only mounted on one side, shield 140 can cover that one side. In an example where the DIMM includes memory devices on both sides, there can be separate shields to mount on either side. The shield on either side can be essentially the same, and be similarly removable with the same or similar connection and securing mechanisms.

When PCB 120 is a DIMM, the component or components that create EMF noise are dynamic random access memory (DRAM) devices. As a DIMM, PCB 120 can include notch 124 that aligns with an alignment tab of arm 114. Arm 114 also includes a retention tab that provides a spring force down on PCB 120. With removable optional shield 140 that covers at least the DRAM devices on PCB 120, shield 140 can also include flange 144 to interface with existing retention tabs. Thus, the retention tab can also secure the shield to the PCB and ensure the contact between shield 140 and ground pads 130.

Figure 1B:
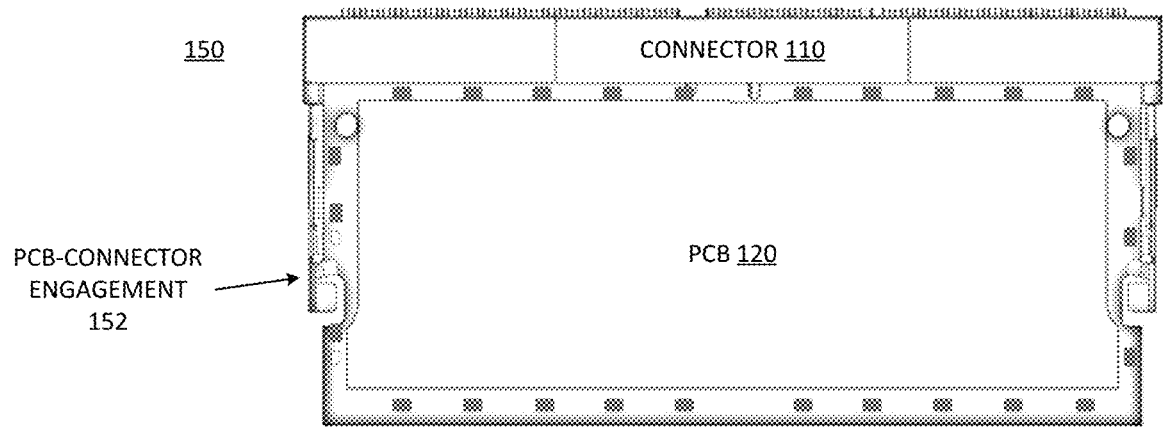
FIG. 1B is a block diagram of an example of a PCB (printed circuit board) interfaced with a corresponding connector with local grounding pads for a removable shield.

FIG. 1B is a block diagram of an example of the PCB of FIG. 1A interfaced with a corresponding connector with local grounding pads for a removable shield. System 150 illustrates the interconnection of connector 110 and PCB 120, which can be the same as connector 110 and PCB 120 of FIG. 1A. When interconnected, it can be observed that notch 124 of PCB 120 aligns with features of arm 114 at PCB-connector engagement 152.

Figure 1C:
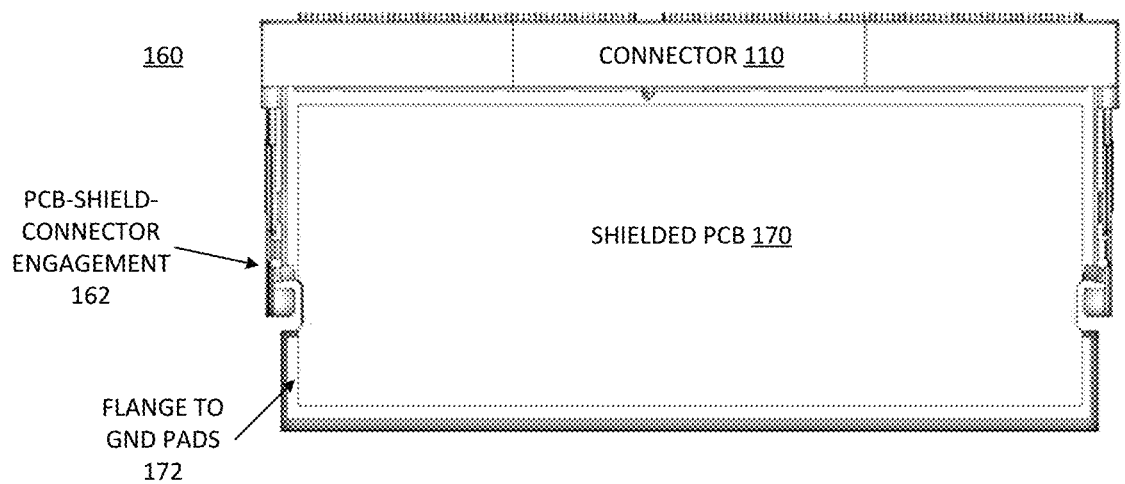
FIG. 1C is a block diagram of an example of a PCB (printed circuit board) with a removable shield engaged with local grounding pads and attached to a corresponding connector.

FIG. 1C is a block diagram of an example of the PCB with the removable shield of FIG. 1A engaged with local grounding pads and attached to a corresponding connector. System 160 illustrates the interconnection of connector 110 and shielded PCB 170, which can be the same as connector 110 and the combination of PCB 120 and shield 140 of FIG. 1A. When interconnected, it can be observed that notch 124 of shielded PCB 170 aligns with features of arm 114 at PCB-connector engagement 162. PCB-connector engagement 162 engages both the PCB and the shield. It will be understood that the shield is removably connected in system 160, and can be removed. With PCB-connector engagement 162, the flange on the shield contacts the ground pads on the PCB. Thus, the securing of shielded PCB 170 into connector 110 creates flange to ground pads electrical contact 172.

Figure 2:
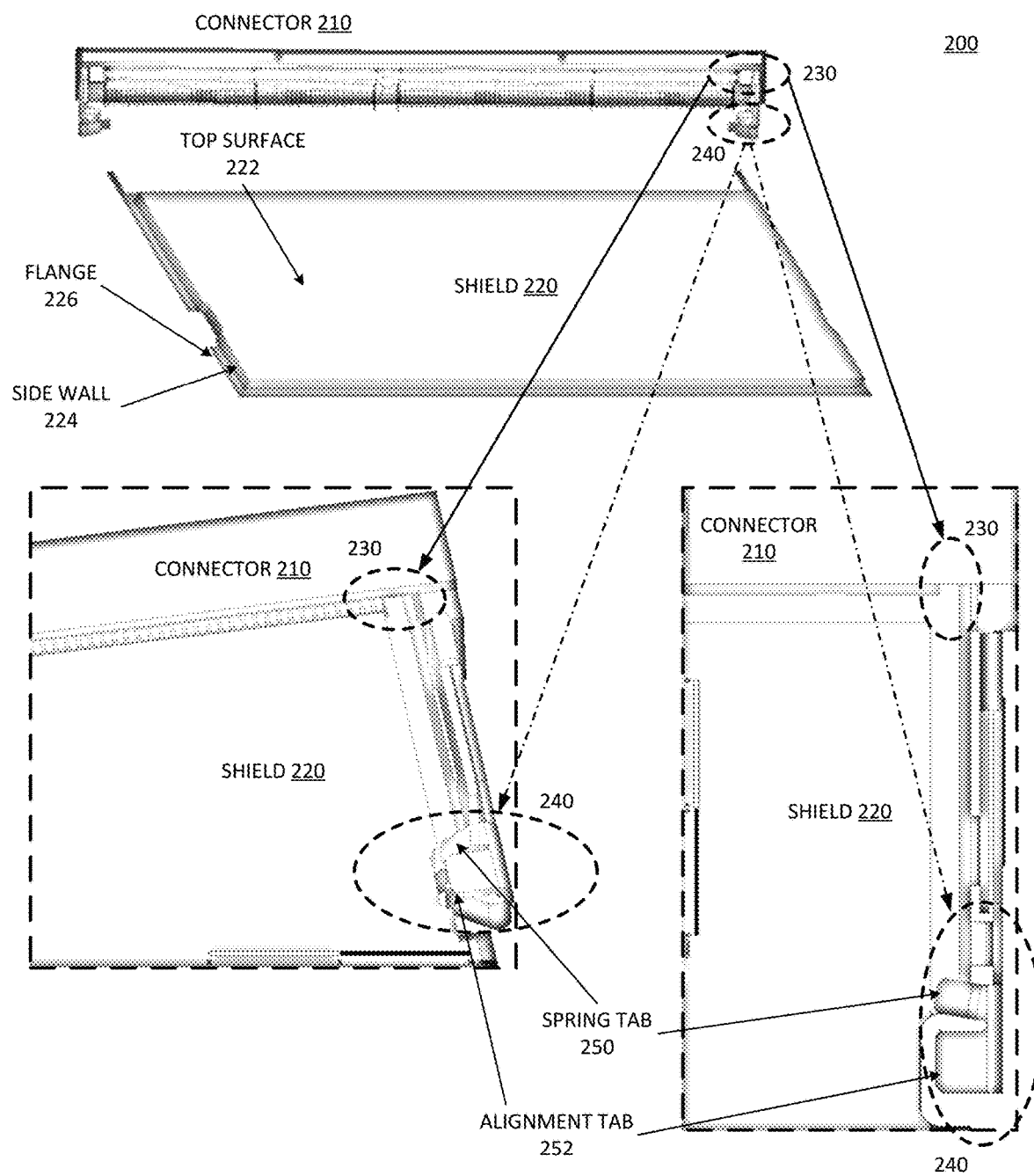
FIG. 2 is a diagrammatic representation of an example of interconnecting a removable shield to a corresponding connector.

FIG. 2 is a diagrammatic representation of an example of interconnecting a removable shield to a corresponding connector. System 200 provides an example of system 100 of FIG. 1A. Connector 210 represents a connector to couple a PCB to a system board. Shield 220 has top surface, which is the surface plane parallel to a plane of the PCB to be covered. Side walls 224 extend from top surface 222 towards the PCB to be covered. Thinking of an orientation with top surface 222 as the top, side wall 224 extends down towards the PCB.

Shield 220 includes flange 226 at the bottom of side wall 224, in reference to the orientation just mentioned. Flange 226 extends out from side wall 224 and provides a lip around the perimeter of shield 220 that can engage with features of the arm of connector 210.

System 200 illustrates segments 230 and 240 where shield 220 engages with connector 210. Shield 220 represents a removable shield that covers a PCB that connects to connector 210. In one example, shield 220 is slipped into connector 210 and engages at segment 230 with a space in connector 210 via locking fingers on the shield.

In one example, shield 220 can be considered a snap on shield because after slipping the shield into connector 210, the shield can be pressed downward (referring to the same orientation mentioned above) until the lock fingers on shield 220 and clips, tabs, or flanges, or a combination of these lock the shield and PCB into position. Segment 240 illustrates a locking clip or spring tab 250. Spring tab 250 represents a clip or tab that applies a spring force or provides force onto flange 226 to secure shield 220 to a corresponding PCB (not specifically shown) and to connector 210. In one example, shield 220 presses down against spring tab 250 until pressing down past the tab, which will then press onto flange 226. With flanges 226 engaged with the arm of connector 210 and the lock fingers locked into position with connector 210, the shield is secured to the PCB and engaged electrically to the PCB ground.

Figure 3A:
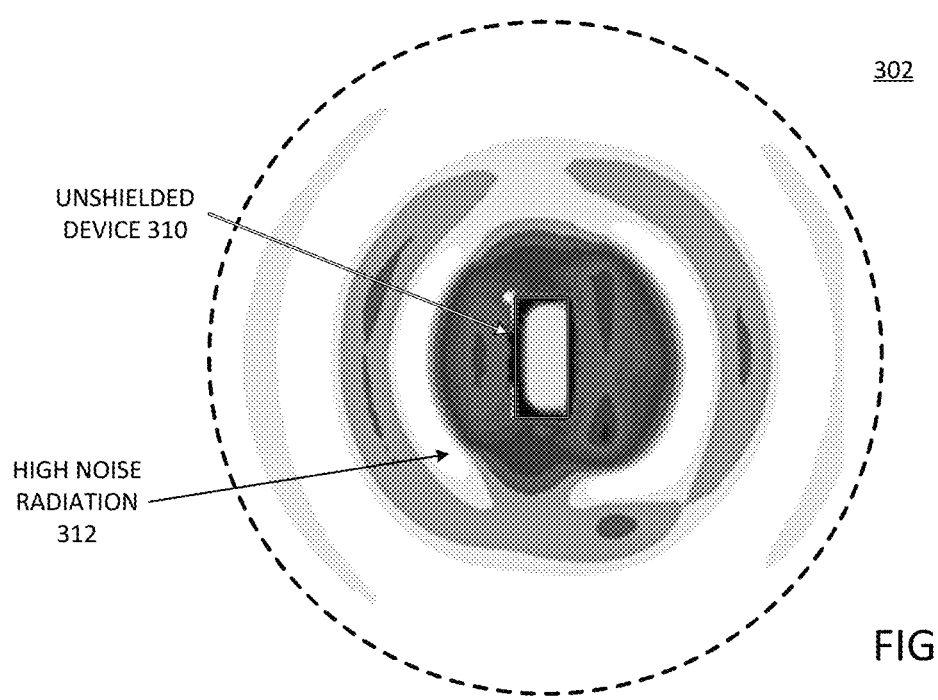
FIG. 3A is a diagram to represent an example of electromagnetic noise from an unshielded device.

FIG. 3A is a diagram to represent an example of electromagnetic noise from an unshielded device. Diagram 302 illustrates radiation noise emitted from unshielded device 310. Unshielded device can be, for example, a DDR DIMM. The darker color indicates higher intensity of energy. As illustrated, unshielded device 310 results in high noise radiation 312.

Figure 3B:
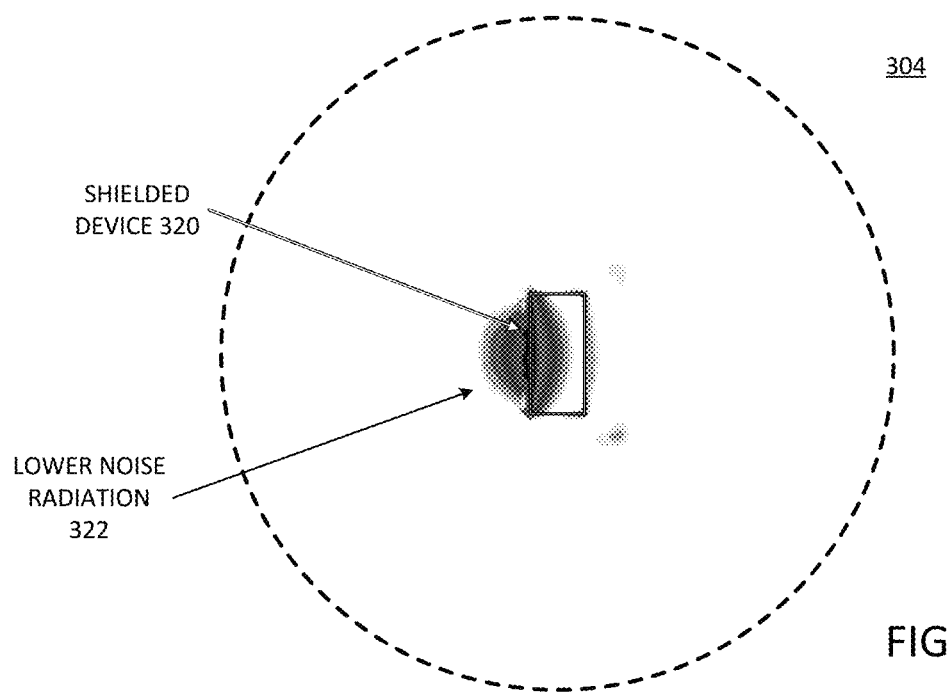
FIG. 3B is a diagram to represent an example of electromagnetic noise from a shielded device.
Figure 4A:
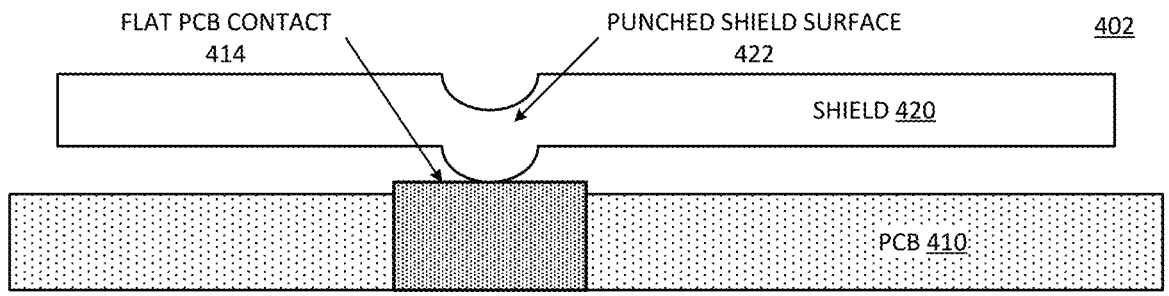
FIGS. 4A-4D are diagrammatic representations of examples of grounding a shield to a local printed circuit board (PCB).
Figure 4B:
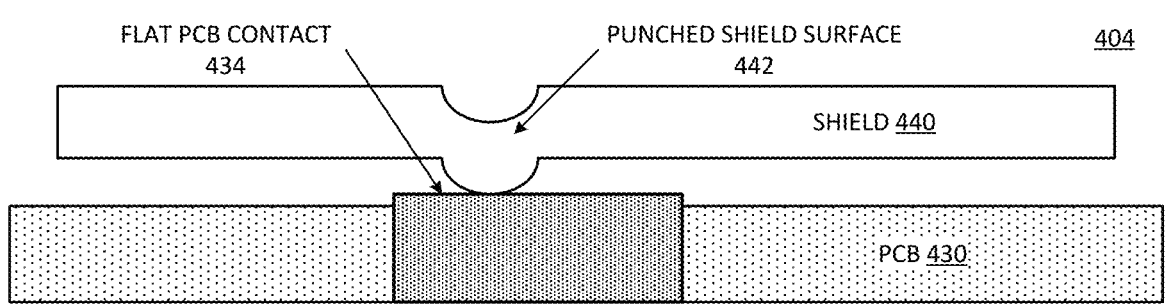
Figure 4C:
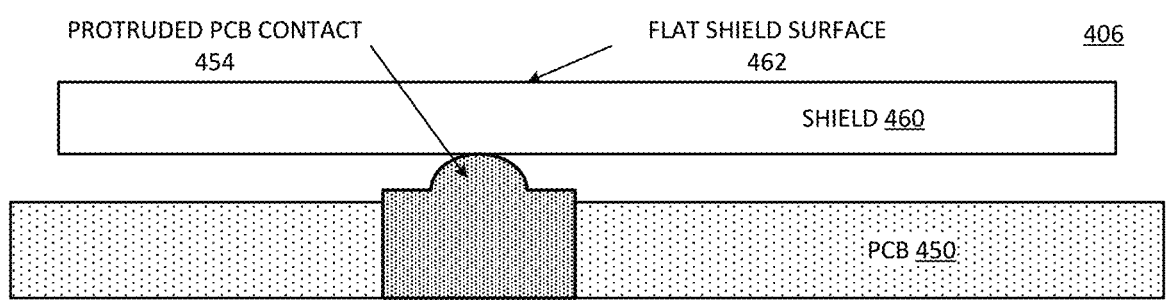
Figure 4D:
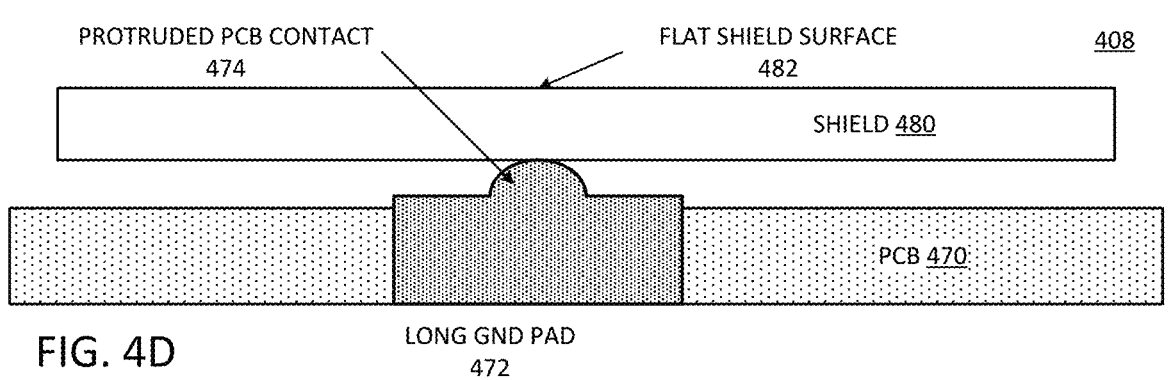

FIG. 3B is a diagram to represent an example of electromagnetic noise from a shielded device. Diagram 304 illustrates a relative comparison to diagram 302. Shielded device 320 represents the same device includes a removable shield in accordance with descriptions herein. The same device, for example, a DDR DIMM, results in lower noise radiation 322. The dashed circle area indicates the same space in diagram 304 as illustrated in diagram 302. Thus, it will be observed how there is significantly less noise energy emitted in diagram 304.

As illustrated, the shield results in greater than 20 dB shielding effectiveness for DIMM noise radiation in a wide frequency range as compared to unshielded device 310. Shielded device 320 was also compared to a device with a floating (non-grounded) shield, which is not specifically illustrated, but the emitted energy has similar noise intensity to diagram 302. Thus, the grounded shield described provides greater than 20 dB shielding effectiveness as compared to a comparable DIMM with a floating shield.

FIGS. 4A-4D are diagrammatic representations of examples of grounding a shield to a local printed circuit board (PCB). Diagrams 402, 404, 406, and 408, respectively, for FIG. 4A, FIG. 4B, FIG. 4C, and FIG. 4D. The contact mechanism between the shield and the PCB ground pads can be any combination of a punched shield surface or flat shield surface, and protruded ground pads or flat ground pads, as illustrated in the diagrams. The diagrams illustrate only a combination between one protruded and one flat surface, but the implementations are not limited to the illustrated configurations. Other means and configurations can also be used. The specific shape of the protrusions illustrated are not necessarily representative, and any shape and size can be used.

Referring to diagram 402, PCB 410 includes short ground (GND) pad 412. Short ground pads can be used where high precision is used with the shield manufacturing and securing of the shield to PCB 410 and a corresponding connector. Shield 420 represents a shield in accordance with any example herein. The component labeled as shield 420 represents a cross-section portion of the flange of the shield.

Shield 420 includes punched shield surface 422, which creates a protrusion from the bottom surface of the flange towards the PCB. Punched shield surface 422 interfaces with flat PCB contact 414. The interconnection between the punched surface of shield 440 and flat PCB contact 434 provides an electrical connection for the shield to ground, which can be maintained by spring force instead of by a type of bonding. The interconnection between the punched surface of shield 420 and flat PCB contact 414 will be understood to create a small space between the shield and the PCB, but the spacing will be very small. The spacing as illustrated in diagram 402 are not necessarily to scale.

Referring to diagram 404, PCB 430 includes long ground pad 432. Long ground pads can be used where high precision is not assured with the interfacing between shield 440 and PCB 430. Shield 440 represents a shield in accordance with any example herein. The component labeled as shield 440 represents a cross-section portion of the flange of the shield.

Shield 440 includes punched shield surface 442, which creates a protrusion from the bottom surface of the flange towards the PCB. Punched shield surface 442 interfaces with flat PCB contact 434. The interconnection between the punched surface of shield 440 and flat PCB contact 434 provides an electrical connection for the shield to ground, which can be maintained by spring force instead of by a type of bonding. The elements illustrated in diagram 404 are not necessarily to scale.

Referring to diagram 406, PCB 450 includes short ground pad 452. Short ground pads can be used where high precision is assured with the interfacing between shield 460 and PCB 450. Shield 460 represents a shield in accordance with any example herein. The component labeled as shield 460 represents a cross-section portion of the flange of the shield.

Shield 460 includes flat shield surface 462. Flat shield surface 462 interfaces with protruded PCB contact 454, which protrudes above the surface of the PCB. The interconnection between the flat surface of shield 460 and protruded PCB contact 454 provides an electrical connection for the shield to ground, which can be maintained by spring force instead of by a type of bonding. The elements illustrated in diagram 406 are not necessarily to scale.

Referring to diagram 408, PCB 470 includes long ground pad 472. Long ground pads can be used where high precision is not assured with the interfacing between shield 480 and PCB 470. Shield 480 represents a shield in accordance with any example herein. The component labeled as shield 480 represents a cross-section portion of the flange of the shield.

Shield 480 includes flat shield surface 482. Flat shield surface 482 interfaces with protruded PCB contact 474, which protrudes above the surface of the PCB. The interconnection between the flat surface of shield 480 and protruded PCB contact 474 provides an electrical connection for the shield to ground, which can be maintained by spring force instead of by a type of bonding. The elements illustrated in diagram 408 are not necessarily to scale.

Figure 5:
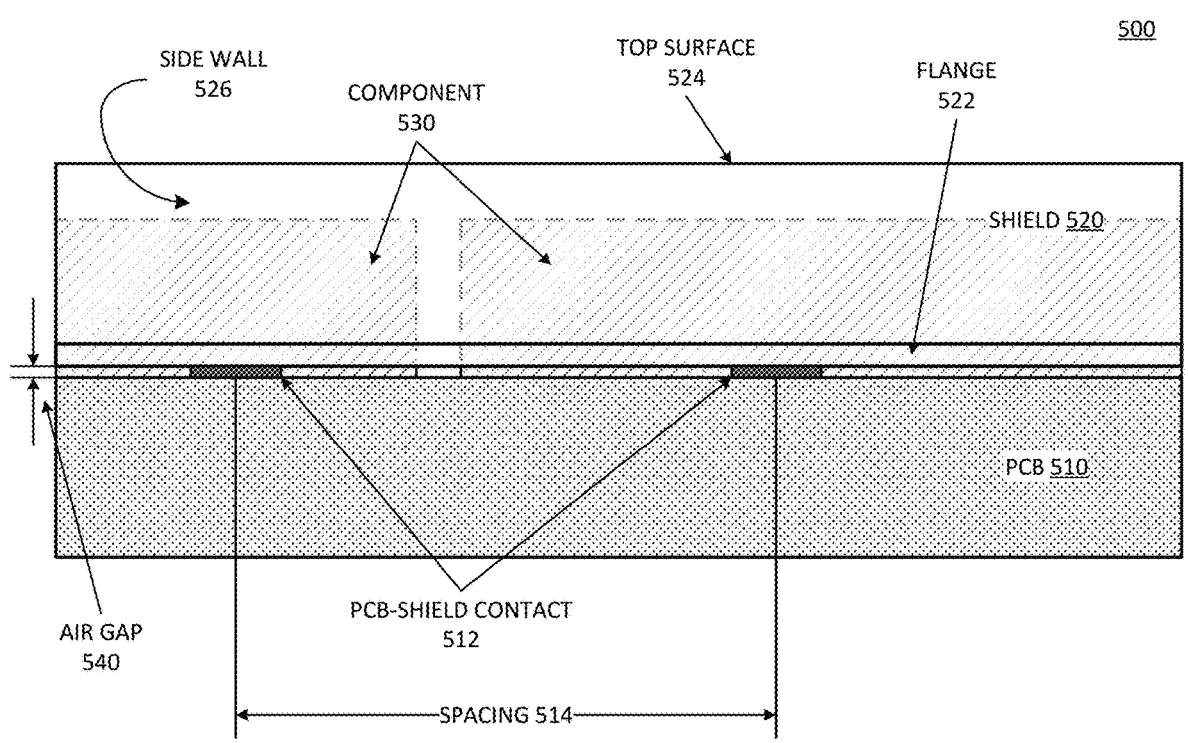
FIG. 5 is a block diagram of an example of PCB components surrounded by a grounded shield.

FIG. 5 is a block diagram of an example of PCB components surrounded by a grounded shield. System 500 provides an example of a PCB with shielding in accordance with any example herein. System 500 includes PCB 510 with components 530 covered by shield 520. The perspective of system 500 is a side view of the PCB with the shield.

Components 530 represent active components of PCB 510 that generate EMI noise. The top part of components 530 are shown dashed because they will be understood to be behind or within the shielding of shield 520. It will be understood that the diagram represents only a portion of the board and shield, and components 530 can extend outside of what is illustrated.

Shield 520 has top surface 524, which is a surface parallel to the component surface of PCB 510. Shield 520 also has side wall 526 to extend away from top surface 524 toward PCB 510. Side wall 526 connects top surface 524 to flange 522. Flange 522 provides a feature in shield 520 to allow mechanical connection of the shield to PCB 510 and an associated connector. The connector can include tabs or other features to press onto flange to press shield 520 towards PCB 510.

System 500 includes PCB-shield contacts 512. The contacts are illustrated in system 500 as PCB-shield contact 512, which can be understood to include a ground pad on PCB 510 and flange 522 of shield 520. PCB-shield contact 512 can be any combination of protruded PCB ground contact, punched shield protrusion in the flange, flat PCB ground contact, flat shield flange, or some other mechanism to create the contact. Typically, a PCB-shield contact will provide the surest electrical contact when there is one protruding side and another flat side. The electrical contact refers to electrical contact to ground, which can ground shield 520 to a local ground plane of PCB 510. It will be understood that a flat flange and a protruded PCB contact may require more complex manufacturing for the PCB contacts, but can provide the surest contact rather than having a protruded punched area of the flange to contact with a flat pad on the PCB.

System 500 illustrates spacing 514 between PCB-shield contacts 512. Spacing 514 can be in accordance with what is described above, with a distance corresponding to $\lambda/10$. System 500 also illustrates air gap 540, which represents a space between flange 522 and PCB 510 that forms as a result of PCB-shield contacts 512. The protruded segments of the electrical contact results in a small gap. In one example, the gap is small enough to be relatively unnoticeable, but does illustrate the contact via a protruded element.

Figure 6:
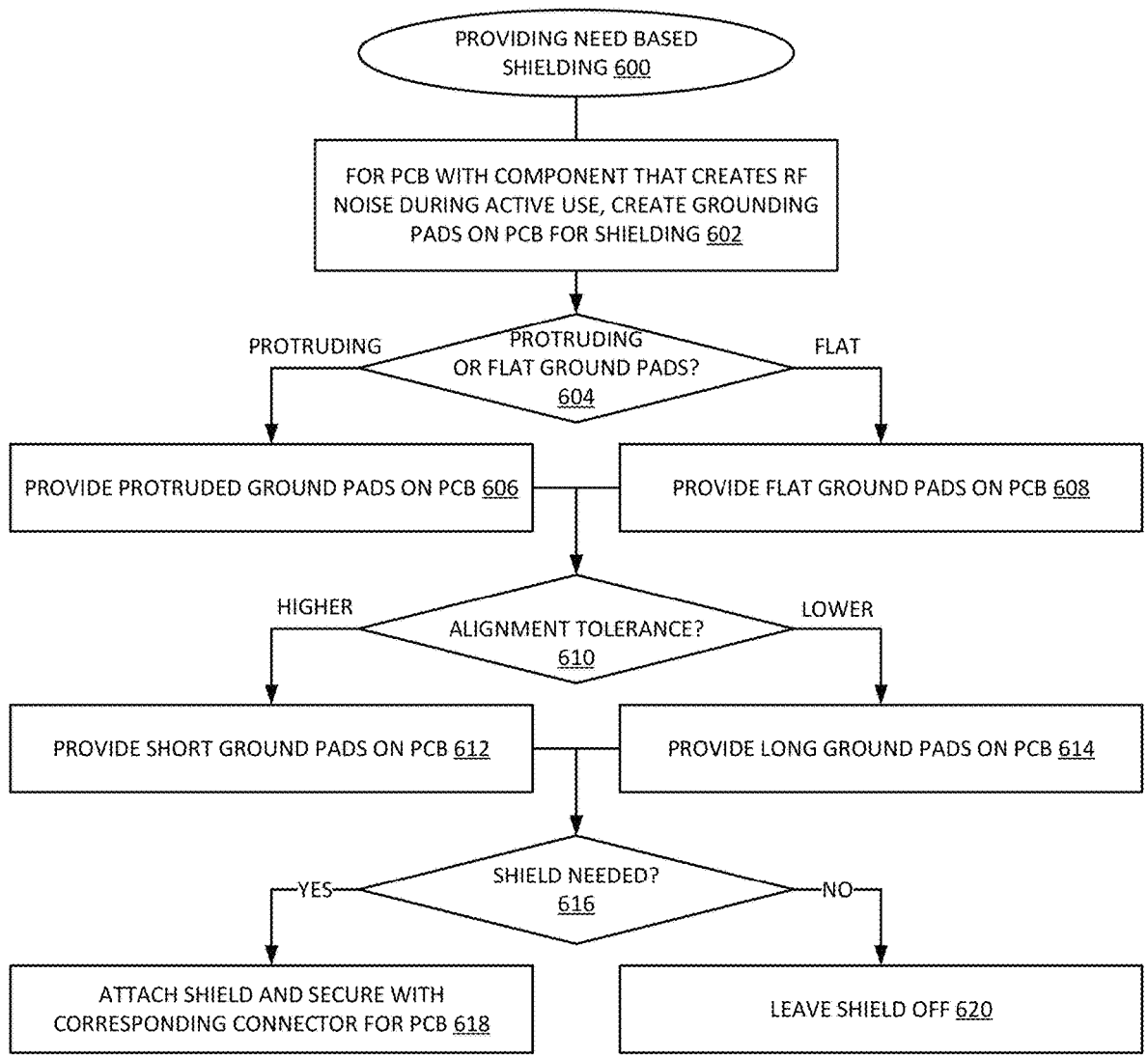
FIG. 6 is a flow diagram of an example of a process for applying as-needed grounded shielding.

FIG. 6 is a flow diagram of an example of a process for applying as-needed grounded shielding. Process 600 represents a process for providing need based removable shielding. For a PCB with a component that creates RF (radio frequency) noise during active use, the designer creates grounding pads on the PCB for shielding, at 602.

In one example, the system designer determines whether to provide protruding or flat ground pads on the PCB, at 604. When protruding ground pads are to be used, the system designer can provide protruded ground pads on the PCB, at 606. When flat ground pads are to be used, the system designer can provide flat ground pads on the PCB, at 608.

In one example, the length of the ground pads depends on the precision to be applied to the component processing and to putting the system together. In one example, if the alignment tolerance is to be relatively high, at 610, the system designer can provide short ground pads on the PCB, at 612. In one example, if the alignment tolerance is to be relatively lower, at 610, the system designer can provide longer ground pads on the PCB, at 614.

In one example, the system designer has the option to provide the grounded shield on the PCB or not use the shield on the PCB. If shielding is needed, at 616 YES branch, in one example, manufacturing can attach the shield and secure it with a corresponding connector for the PCB, which also connects it to the PCB, at 618. If shielding is not needed, at 616 NO branch, in one example, manufacturing can leave the shield off, at 620.

Figure 7:
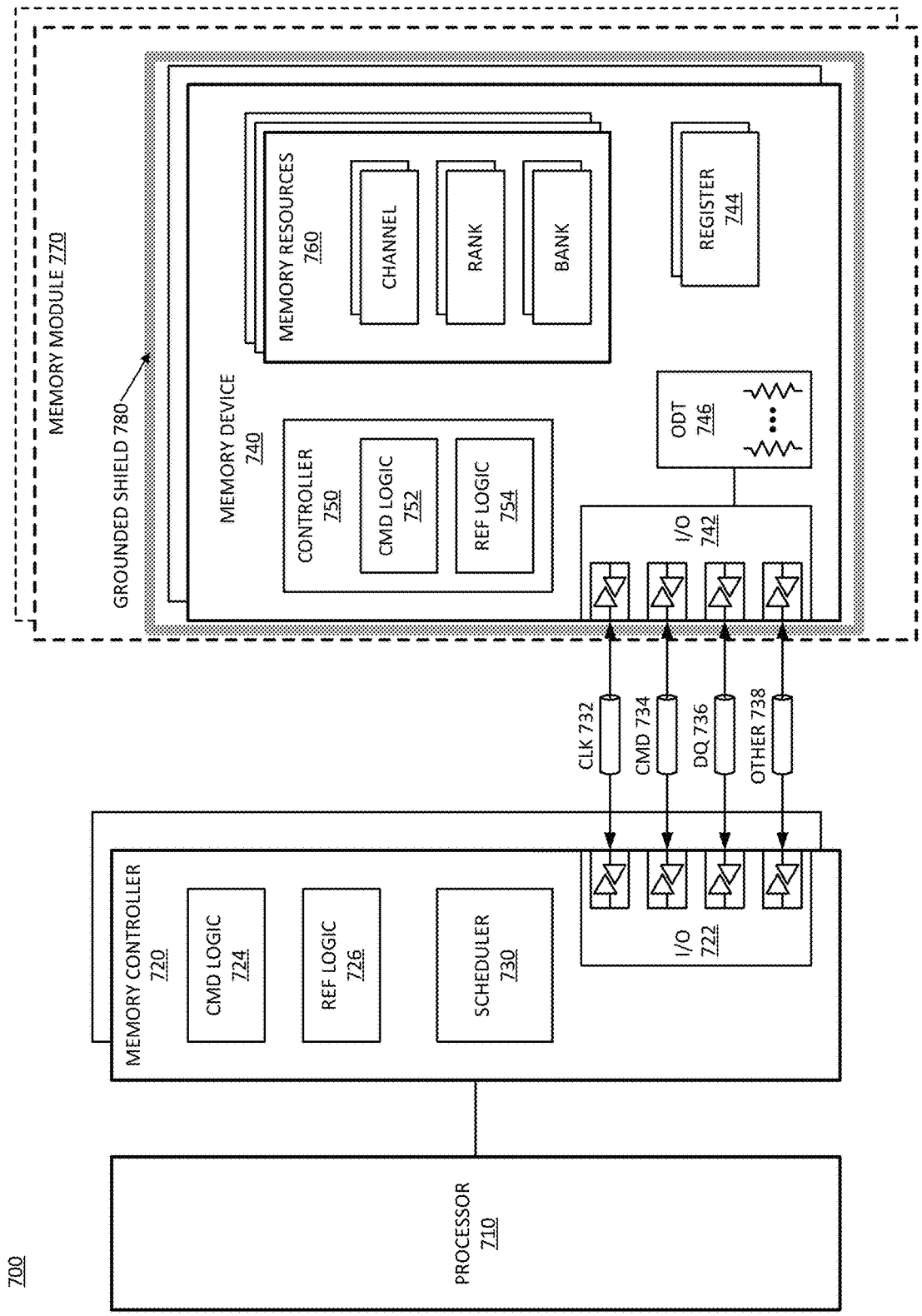
FIG. 7 is a block diagram of an example of a memory subsystem in which grounded shielding can be implemented.

FIG. 7 is a block diagram of an example of a memory subsystem in which grounded shielding can be implemented. System 700 includes a processor and elements of a memory subsystem in a computing device.

In one example, system 700 includes grounded shield 780 on memory module 770. Grounded shield 780 can be according to any shield described herein. Grounded shield 780 interconnects to ground contacts on memory module 770. Grounded shield 780 includes mechanical features to interface with a connector that couples memory module 770 to memory controller 720 and processor 710. The features secure the shielding in a non-permanent way, providing for a removable shield.

Processor 710 represents a processing unit of a computing platform that may execute an operating system (OS) and applications, which can collectively be referred to as the host or the user of the memory. The OS and applications execute operations that result in memory accesses. Processor 710 can include one or more separate processors. Each separate processor can include a single processing unit, a multicore processing unit, or a combination. The processing unit can be a primary processor such as a CPU (central processing unit), a peripheral processor such as a GPU (graphics processing unit), or a combination. Memory accesses may also be initiated by devices such as a network controller or hard disk controller. Such devices can be integrated with the processor in some systems or attached to the processor via a bus (e.g., PCI express), or a combination. System 700 can be implemented as an SOC (system on a chip), or be implemented with standalone components.

Reference to memory devices can apply to different memory types. Memory devices often refers to volatile memory technologies. Volatile memory is memory whose state (and therefore the data stored on it) is indeterminate if power is interrupted to the device. Nonvolatile memory refers to memory whose state is determinate even if power is interrupted to the device. Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, such as DDR4 (DDR version 4, JESD79, initial specification published in September 2012 by JEDEC), LPDDR4 (low power DDR version 4, JESD209-4, originally published by JEDEC in August 2014), WIO2 (Wide I/O 2 (WideIO2), JESD229-2, originally published by JEDEC in August 2014), HBM (high bandwidth memory DRAM, JESD235A, originally published by JEDEC in November 2015), DDR5 (DDR version 5, currently in discussion by JEDEC), LPDDR5 (low power DDR version 5, JESD209-5, originally published by JEDEC in February 2019), HBM2 ((HBM version 2), currently in discussion by JEDEC), or others or combinations of memory technologies, and technologies based on derivatives or extensions of such specifications.

In addition to, or alternatively to, volatile memory, in one example, reference to memory devices can refer to a nonvolatile memory device whose state is determinate even if power is interrupted to the device. In one example, the nonvolatile memory device is a block addressable memory device, such as NAND or NOR technologies. Thus, a memory device can also include a future generation nonvolatile devices, such as a three dimensional crosspoint memory device, other byte addressable nonvolatile memory devices, or memory devices that use chalcogenide phase change material (e.g., chalcogenide glass). In one example, the memory device can be or include multi-threshold level NAND flash memory, NOR flash memory, single or multi-level phase change memory (PCM) or phase change memory with a switch (PCMS), a resistive memory, nanowire memory, ferroelectric transistor random access memory (FeTRAM), magnetoresistive random access memory (MRAM) memory that incorporates memristor technology, or spin transfer torque (STT)-MRAM, or a combination of any of the above, or other memory.

Descriptions herein referring to a "RAM" or "RAM device" can apply to any memory device that allows random access, whether volatile or nonvolatile. Descriptions referring to a "DRAM" or a "DRAM device" can refer to a volatile random access memory device. The memory device or DRAM can refer to the die itself, to a packaged memory product that includes one or more dies, or both. In one example, a system with volatile memory that needs to be refreshed can also include nonvolatile memory.

Memory controller 720 represents one or more memory controller circuits or devices for system 700. Memory controller 720 represents control logic that generates memory access commands in response to the execution of operations by processor 710. Memory controller 720 accesses one or more memory devices 740. Memory devices 740 can be DRAM devices in accordance with any referred to above. In one example, memory devices 740 are organized and managed as different channels, where each channel couples to buses and signal lines that couple to multiple memory devices in parallel. Each channel is independently operable. Thus, each channel is independently accessed and controlled, and the timing, data transfer, command and address exchanges, and other operations are separate for each channel. Coupling can refer to an electrical coupling, communicative coupling, physical coupling, or a combination of these. Physical coupling can include direct contact. Electrical coupling includes an interface or interconnection that allows electrical flow between components, or allows signaling between components, or both. Communicative coupling includes connections, including wired or wireless, that enable components to exchange data.

In one example, settings for each channel are controlled by separate mode registers or other register settings. In one example, each memory controller 720 manages a separate memory channel, although system 700 can be configured to have multiple channels managed by a single controller, or to have multiple controllers on a single channel. In one example, memory controller 720 is part of host processor 710, such as logic implemented on the same die or implemented in the same package space as the processor.

Memory controller 720 includes I/O interface logic 722 to couple to a memory bus, such as a memory channel as referred to above. I/O interface logic 722 (as well as I/O interface logic 742 of memory device 740) can include pins, pads, connectors, signal lines, traces, or wires, or other hardware to connect the devices, or a combination of these. I/O interface logic 722 can include a hardware interface. As illustrated, I/O interface logic 722 includes at least drivers/transceivers for signal lines. Commonly, wires within an integrated circuit interface couple with a pad, pin, or connector to interface signal lines or traces or other wires between devices. I/O interface logic 722 can include drivers, receivers, transceivers, or termination, or other circuitry or combinations of circuitry to exchange signals on the signal lines between the devices. The exchange of signals includes at least one of transmit or receive. While shown as coupling I/O 722 from memory controller 720 to I/O 742 of memory device 740, it will be understood that in an implementation of system 700 where groups of memory devices 740 are accessed in parallel, multiple memory devices can include I/O interfaces to the same interface of memory controller 720. In an implementation of system 700 including one or more memory modules 770, I/O 742 can include interface hardware of the memory module in addition to interface hardware on the memory device itself. Other memory controllers 720 will include separate interfaces to other memory devices 740.

The bus between memory controller 720 and memory devices 740 can be implemented as multiple signal lines coupling memory controller 720 to memory devices 740. The bus may typically include at least clock (CLK) 732, command/address (CMD) 734, and write data (DQ) and read data (DQ) 736, and zero or more other signal lines 738. In one example, a bus or connection between memory controller 720 and memory can be referred to as a memory bus. The signal lines for CMD can be referred to as a "C/A bus" (or ADD/CMD bus, or some other designation indicating the transfer of commands (C or CMD) and address (A or ADD) information) and the signal lines for write and read DQ can be referred to as a "data bus." In one example, independent channels have different clock signals, C/A buses, data buses, and other signal lines. Thus, system 700 can be considered to have multiple "buses," in the sense that an independent interface path can be considered a separate bus. It will be understood that in addition to the lines explicitly shown, a bus can include at least one of strobe signaling lines, alert lines, auxiliary lines, or other signal lines, or a combination. It will also be understood that serial bus technologies can be used for the connection between memory controller 720 and memory devices 740. An example of a serial bus technology is 8B10B encoding and transmission of high-speed data with embedded clock over a single differential pair of signals in each direction. In one example, CMD 734 represents signal lines shared in parallel with multiple memory devices. In one example, multiple memory devices share encoding command signal lines of CMD 734, and each has a separate chip select (CS_n) signal line to select individual memory devices.

It will be understood that in the example of system 700, the bus between memory controller 720 and memory devices 740 includes a subsidiary command bus CMD 734 and a subsidiary bus to carry the write and read data, DQ 736. In one example, the data bus can include bidirectional lines for read data and for write/command data. In another example, the subsidiary bus DQ 736 can include unidirectional write signal lines for write and data from the host to memory, and can include unidirectional lines for read data from the memory to the host. In accordance with the chosen memory technology and system design, other signals 738 may accompany a bus or sub bus, such as strobe lines DQS. Based on design of system 700, or implementation if a design supports multiple implementations, the data bus can have more or less bandwidth per memory device 740. For example, the data bus can support memory devices that have either a x32 interface, a x16 interface, a x8 interface, or other interface. The convention "xW," where W is an integer that refers to an interface size or width of the interface of memory device 740, which represents a number of signal lines to exchange data with memory controller 720. The interface size of the memory devices is a controlling factor on how many memory devices can be used concurrently per channel in system 700 or coupled in parallel to the same signal lines. In one example, high bandwidth memory devices, wide interface devices, or stacked memory configurations, or combinations, can enable wider interfaces, such as a x128 interface, a x256 interface, a x512 interface, a x1024 interface, or other data bus interface width.

In one example, memory devices 740 and memory controller 720 exchange data over the data bus in a burst, or a sequence of consecutive data transfers. The burst corresponds to a number of transfer cycles, which is related to a bus frequency. In one example, the transfer cycle can be a whole clock cycle for transfers occurring on a same clock or strobe signal edge (e.g., on the rising edge). In one example, every clock cycle, referring to a cycle of the system clock, is separated into multiple unit intervals (UIs), where each UI is a transfer cycle. For example, double data rate transfers trigger on both edges of the clock signal (e.g., rising and falling). A burst can last for a configured number of UIs, which can be a configuration stored in a register, or triggered on the fly. For example, a sequence of eight consecutive transfer periods can be considered a burst length 8 (BL8), and each memory device 740 can transfer data on each UI. Thus, a x8 memory device operating on BL8 can transfer 74 bits of data (8 data signal lines times 8 data bits transferred per line over the burst). It will be understood that this simple example is merely an illustration and is not limiting.

Memory devices 740 represent memory resources for system 700. In one example, each memory device 740 is a separate memory die. In one example, each memory device 740 can interface with multiple (e.g., 2) channels per device or die. Each memory device 740 includes I/O interface logic 742, which has a bandwidth determined by the implementation of the device (e.g., x16 or x8 or some other interface bandwidth). I/O interface logic 742 enables the memory devices to interface with memory controller 720. I/O interface logic 742 can include a hardware interface, and can be in accordance with I/O 722 of memory controller, but at the memory device end. In one example, multiple memory devices 740 are connected in parallel to the same command and data buses. In another example, multiple memory devices 740 are connected in parallel to the same command bus, and are connected to different data buses. For example, system 700 can be configured with multiple memory devices 740 coupled in parallel, with each memory device responding to a command, and accessing memory resources 760 internal to each. For a Write operation, an individual memory device 740 can write a portion of the overall data word, and for a Read operation, an individual memory device 740 can fetch a portion of the overall data word. As non-limiting examples, a specific memory device can provide or receive, respectively, 8 bits of a 128-bit data word for a Read or Write transaction, or 8 bits or 16 bits (depending for a x8 or a x16 device) of a 256-bit data word. The remaining bits of the word will be provided or received by other memory devices in parallel.

In one example, memory devices 740 are disposed directly on a motherboard or host system platform (e.g., a PCB (printed circuit board) on which processor 710 is disposed) of a computing device. In one example, memory devices 740 can be organized into memory modules 770. In one example, memory modules 770 represent dual inline memory modules (DIMMs). In one example, memory modules 770 represent other organization of multiple memory devices to share at least a portion of access or control circuitry, which can be a separate circuit, a separate device, or a separate board from the host system platform. Memory modules 770 can include multiple memory devices 740, and the memory modules can include support for multiple separate channels to the included memory devices disposed on them. In another example, memory devices 740 may be incorporated into the same package as memory controller 720, such as by techniques such as multi-chip-module (MCM), package-on-package, through-silicon via (TSV), or other techniques or combinations. Similarly, in one example, multiple memory devices 740 may be incorporated into memory modules 770, which themselves may be incorporated into the same package as memory controller 720. It will be appreciated that for these and other implementations, memory controller 720 may be part of host processor 710.

Memory devices 740 each include memory resources 760. Memory resources 760 represent individual arrays of memory locations or storage locations for data. Typically memory resources 760 are managed as rows of data, accessed via wordline (rows) and bitline (individual bits within a row) control. Memory resources 760 can be organized as separate channels, ranks, and banks of memory. Channels may refer to independent control paths to storage locations within memory devices 740. Ranks may refer to common locations across multiple memory devices (e.g., same row addresses within different devices). Banks may refer to arrays of memory locations within a memory device 740. In one example, banks of memory are divided into sub-banks with at least a portion of shared circuitry (e.g., drivers, signal lines, control logic) for the sub-banks, allowing separate addressing and access. It will be understood that channels, ranks, banks, sub-banks, bank groups, or other organizations of the memory locations, and combinations of the organizations, can overlap in their application to physical resources. For example, the same physical memory locations can be accessed over a specific channel as a specific bank, which can also belong to a rank. Thus, the organization of memory resources will be understood in an inclusive, rather than exclusive, manner.

In one example, memory devices 740 include one or more registers 744. Register 744 represents one or more storage devices or storage locations that provide configuration or settings for the operation of the memory device. In one example, register 744 can provide a storage location for memory device 740 to store data for access by memory controller 720 as part of a control or management operation. In one example, register 744 includes one or more Mode Registers. In one example, register 744 includes one or more multipurpose registers. The configuration of locations within register 744 can configure memory device 740 to operate in different "modes," where command information can trigger different operations within memory device 740 based on the mode. Additionally or in the alternative, different modes can also trigger different operation from address information or other signal lines depending on the mode. Settings of register 744 can indicate configuration for I/O settings (e.g., timing, termination or ODT (on-die termination) 746, driver configuration, or other I/O settings).

In one example, memory device 740 includes ODT 746 as part of the interface hardware associated with I/O 742. ODT 746 can be configured as mentioned above, and provide settings for impedance to be applied to the interface to specified signal lines. In one example, ODT 746 is applied to DQ signal lines. In one example, ODT 746 is applied to command signal lines. In one example, ODT 746 is applied to address signal lines. In one example, ODT 746 can be applied to any combination of the preceding. The ODT settings can be changed based on whether a memory device is a selected target of an access operation or a non-target device. ODT 746 settings can affect the timing and reflections of signaling on the terminated lines. Careful control over ODT 746 can enable higher-speed operation with improved matching of applied impedance and loading. ODT 746 can be applied to specific signal lines of I/O interface 742, 722, and is not necessarily applied to all signal lines.

Memory device 740 includes controller 750, which represents control logic within the memory device to control internal operations within the memory device. For example, controller 750 decodes commands sent by memory controller 720 and generates internal operations to execute or satisfy the commands. Controller 750 can be referred to as an internal controller, and is separate from memory controller 720 of the host. Controller 750 can determine what mode is selected based on register 744, and configure the internal execution of operations for access to memory resources 760 or other operations based on the selected mode. Controller 750 generates control signals to control the routing of bits within memory device 740 to provide a proper interface for the selected mode and direct a command to the proper memory locations or addresses. Controller 750 includes command logic 752, which can decode command encoding received on command and address signal lines. Thus, command logic 752 can be or include a command decoder. With command logic 752, memory device can identify commands and generate internal operations to execute requested commands.

Referring again to memory controller 720, memory controller 720 includes command (CMD) logic 724, which represents logic or circuitry to generate commands to send to memory devices 740. The generation of the commands can refer to the command prior to scheduling, or the preparation of queued commands ready to be sent. Generally, the signaling in memory subsystems includes address information within or accompanying the command to indicate or select one or more memory locations where the memory devices should execute the command. In response to scheduling of transactions for memory device 740, memory controller 720 can issue commands via I/O 722 to cause memory device 740 to execute the commands. In one example, controller 750 of memory device 740 receives and decodes command and address information received via I/O 742 from memory controller 720. Based on the received command and address information, controller 750 can control the timing of operations of the logic and circuitry within memory device 740 to execute the commands. Controller 750 is responsible for compliance with standards or specifications within memory device 740, such as timing and signaling requirements. Memory controller 720 can implement compliance with standards or specifications by access scheduling and control.

Memory controller 720 includes scheduler 730, which represents logic or circuitry to generate and order transactions to send to memory device 740. From one perspective, the primary function of memory controller 720 could be said to schedule memory access and other transactions to memory device 740. Such scheduling can include generating the transactions themselves to implement the requests for data by processor 710 and to maintain integrity of the data (e.g., such as with commands related to refresh). Transactions can include one or more commands, and result in the transfer of commands or data or both over one or multiple timing cycles such as clock cycles or unit intervals. Transactions can be for access such as read or write or related commands or a combination, and other transactions can include memory management commands for configuration, settings, data integrity, or other commands or a combination.

Memory controller 720 typically includes logic such as scheduler 730 to allow selection and ordering of transactions to improve performance of system 700. Thus, memory controller 720 can select which of the outstanding transactions should be sent to memory device 740 in which order, which is typically achieved with logic much more complex that a simple first-in first-out algorithm. Memory controller 720 manages the transmission of the transactions to memory device 740, and manages the timing associated with the transaction. In one example, transactions have deterministic timing, which can be managed by memory controller 720 and used in determining how to schedule the transactions with scheduler 730.

In one example, memory controller 720 includes refresh (REF) logic 726. Refresh logic 726 can be used for memory resources that are volatile and need to be refreshed to retain a deterministic state. In one example, refresh logic 726 indicates a location for refresh, and a type of refresh to perform. Refresh logic 726 can trigger self-refresh within memory device 740, or execute external refreshes which can be referred to as auto refresh commands) by sending refresh commands, or a combination. In one example, system 700 supports all bank refreshes as well as per bank refreshes. All bank refreshes cause the refreshing of banks within all memory devices 740 coupled in parallel. Per bank refreshes cause the refreshing of a specified bank within a specified memory device 740. In one example, controller 750 within memory device 740 includes refresh logic 754 to apply refresh within memory device 740. In one example, refresh logic 754 generates internal operations to perform refresh in accordance with an external refresh received from memory controller 720. Refresh logic 754 can determine if a refresh is directed to memory device 740, and what memory resources 760 to refresh in response to the command.

Figure 8:
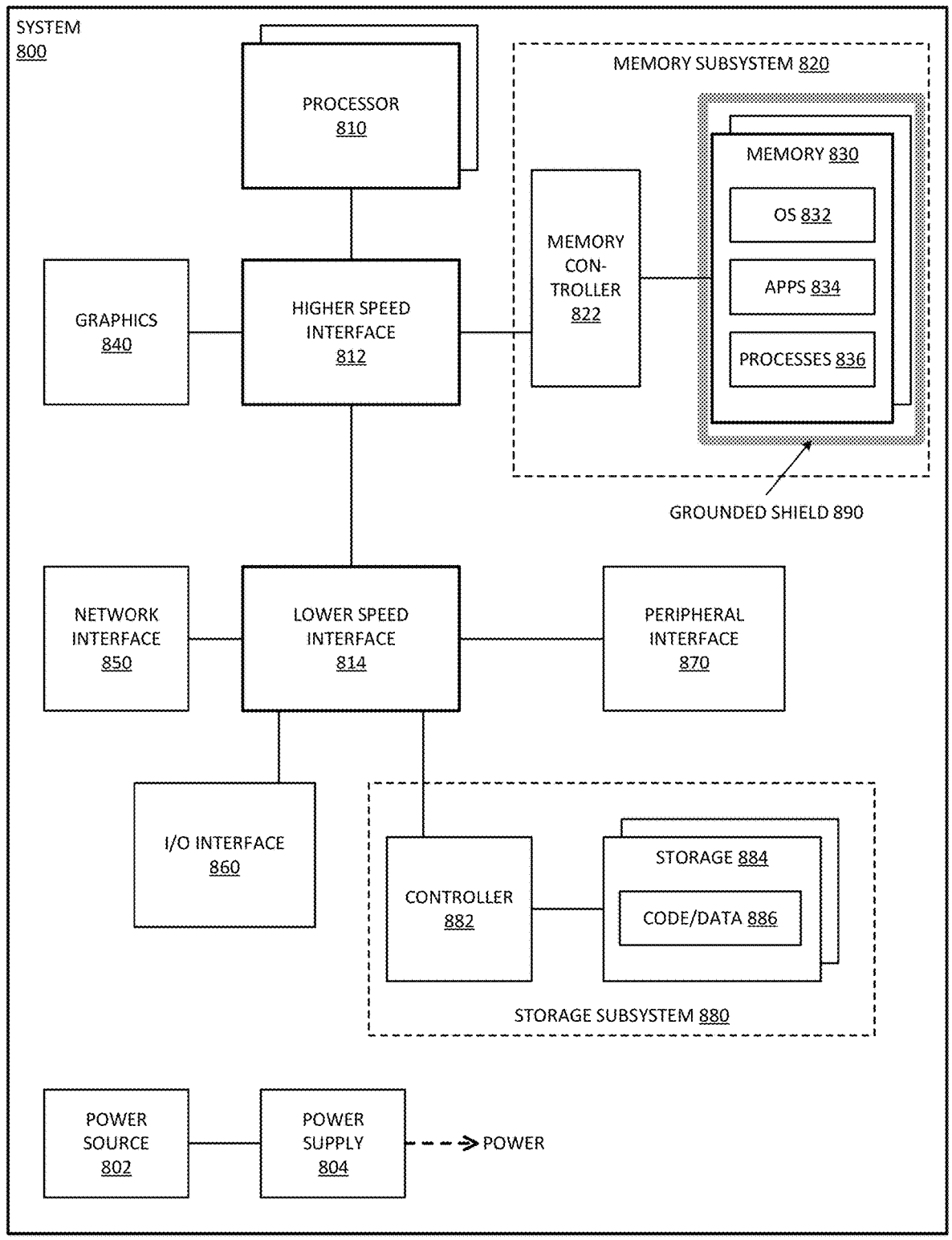
FIG. 8 is a block diagram of an example of a computing system in which grounded shielding can be implemented.

FIG. 8 is a block diagram of an example of a computing system in which grounded shielding can be implemented. System 800 represents a computing device in accordance with any example herein, and can be a laptop computer, a desktop computer, a tablet computer, a server, a gaming or entertainment control system, embedded computing device, or other electronic device.

In one example, system 800 includes grounded shield 890 on memory 830, such as on a memory module that provides memory 830 to system 800. Grounded shield 890 can be according to any shield described herein. Grounded shield 890 interconnects to ground contacts on memory 830. Grounded shield 890 includes mechanical features to interface with a connector that couples memory 830 to memory controller 822. The features secure the shielding in a nonpermanent way, providing for a removable shield.

System 800 includes processor 810 can include any type of microprocessor, central processing unit (CPU), graphics processing unit (GPU), processing core, or other processing hardware, or a combination, to provide processing or execution of instructions for system 800. Processor 810 controls the overall operation of system 800, and can be or include, one or more programmable general-purpose or special-purpose microprocessors, digital signal processors (DSPs), programmable controllers, application specific integrated circuits (ASICs), programmable logic devices (PLDs), or a combination of such devices.

In one example, system 800 includes interface 812 coupled to processor 810, which can represent a higher speed interface or a high throughput interface for system components that need higher bandwidth connections, such as memory subsystem 820 or graphics interface components 840. Interface 812 represents an interface circuit, which can be a standalone component or integrated onto a processor die. Interface 812 can be integrated as a circuit onto the processor die or integrated as a component on a system on a chip. Where present, graphics interface 840 interfaces to graphics components for providing a visual display to a user of system 800. Graphics interface 840 can be a standalone component or integrated onto the processor die or system on a chip. In one example, graphics interface 840 can drive a high definition (HD) display that provides an output to a user. In one example, the display can include a touchscreen display. In one example, graphics interface 840 generates a display based on data stored in memory 830 or based on operations executed by processor 810 or both.

Memory subsystem 820 represents the main memory of system 800, and provides storage for code to be executed by processor 810, or data values to be used in executing a routine. Memory subsystem 820 can include one or more memory devices 830 such as read-only memory (ROM), flash memory, one or more varieties of random access memory (RAM) such as DRAM, or other memory devices, or a combination of such devices. Memory 830 stores and hosts, among other things, operating system (OS) 832 to provide a software platform for execution of instructions in system 800. Additionally, applications 834 can execute on the software platform of OS 832 from memory 830. Applications 834 represent programs that have their own operational logic to perform execution of one or more functions. Processes 836 represent agents or routines that provide auxiliary functions to OS 832 or one or more applications 834 or a combination. OS 832, applications 834, and processes 836 provide software logic to provide functions for system 800. In one example, memory subsystem 820 includes memory controller 822, which is a memory controller to generate and issue commands to memory 830. It will be understood that memory controller 822 could be a physical part of processor 810 or a physical part of interface 812. For example, memory controller 822 can be an integrated memory controller, integrated onto a circuit with processor 810, such as integrated onto the processor die or a system on a chip.

While not specifically illustrated, it will be understood that system 800 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or other bus, or a combination.

In one example, system 800 includes interface 814, which can be coupled to interface 812. Interface 814 can be a lower speed interface than interface 812. In one example, interface 814 represents an interface circuit, which can include standalone components and integrated circuitry. In one example, multiple user interface components or peripheral components, or both, couple to interface 814. Network interface 850 provides system 800 the ability to communicate with remote devices (e.g., servers or other computing devices) over one or more networks. Network interface 850 can include an Ethernet adapter, wireless interconnection components, cellular network interconnection components, USB (universal serial bus), or other wired or wireless standards-based or proprietary interfaces. Network interface 850 can exchange data with a remote device, which can include sending data stored in memory or receiving data to be stored in memory.

In one example, system 800 includes one or more input/output (I/O) interface(s) 860. I/O interface 860 can include one or more interface components through which a user interacts with system 800 (e.g., audio, alphanumeric, tactile/touch, or other interfacing). Peripheral interface 870 can include any hardware interface not specifically mentioned above. Peripherals refer generally to devices that connect dependently to system 800. A dependent connection is one where system 800 provides the software platform or hardware platform or both on which operation executes, and with which a user interacts.

In one example, system 800 includes storage subsystem 880 to store data in a nonvolatile manner. In one example, in certain system implementations, at least certain components of storage 880 can overlap with components of memory subsystem 820. Storage subsystem 880 includes storage device(s) 884, which can be or include any conventional medium for storing large amounts of data in a nonvolatile manner, such as one or more magnetic, solid state, or optical based disks, or a combination. Storage 884 holds code or instructions and data 886 in a persistent state (i.e., the value is retained despite interruption of power to system 800). Storage 884 can be generically considered to be a "memory," although memory 830 is typically the executing or operating memory to provide instructions to processor 810. Whereas storage 884 is nonvolatile, memory 830 can include volatile memory (i.e., the value or state of the data is indeterminate if power is interrupted to system 800). In one example, storage subsystem 880 includes controller 882 to interface with storage 884. In one example controller 882 is a physical part of interface 814 or processor 810, or can include circuits or logic in both processor 810 and interface 814.

Power source 802 provides power to the components of system 800. More specifically, power source 802 typically interfaces to one or multiple power supplies 804 in system 800 to provide power to the components of system 800. In one example, power supply 804 includes an AC to DC (alternating current to direct current) adapter to plug into a wall outlet. Such AC power can be renewable energy (e.g., solar power) power source 802. In one example, power source 802 includes a DC power source, such as an external AC to DC converter. In one example, power source 802 or power supply 804 includes wireless charging hardware to charge via proximity to a charging field. In one example, power source 802 can include an internal battery or fuel cell source.

Figure 9:
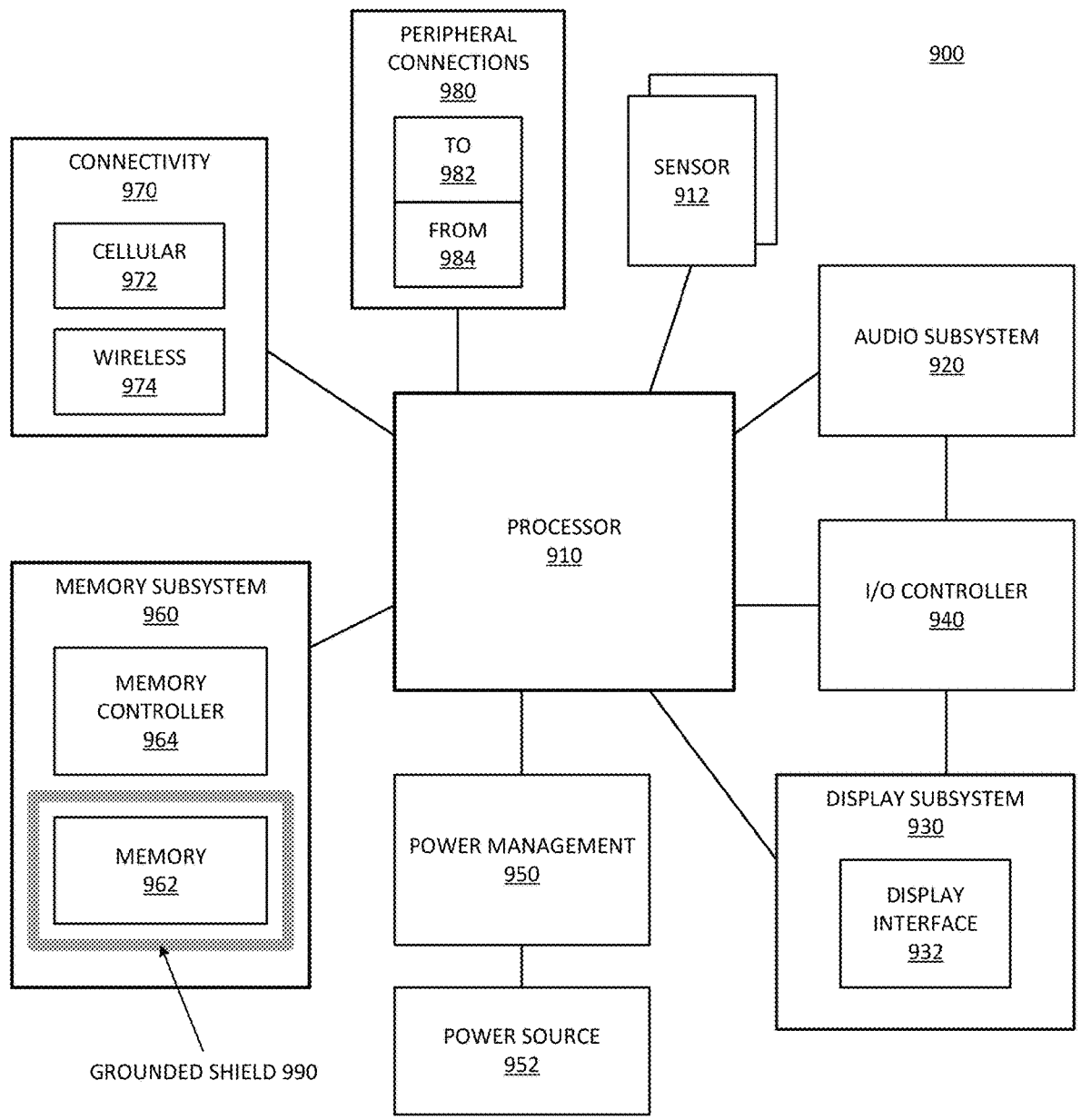
FIG. 9 is a block diagram of an example of a mobile device in which grounded shielding can be implemented.

FIG. 9 is a block diagram of an example of a mobile device in which grounded shielding can be implemented. Device 900 represents a mobile computing device, such as a computing tablet, a mobile phone or smartphone, wearable computing device, or other mobile device, or an embedded computing device. It will be understood that certain of the components are shown generally, and not all components of such a device are shown in device 900.

In one example, system 900 includes grounded shield 990 on memory 962, such as on a memory module that provides memory 962 to system 900. Grounded shield 990 can be according to any shield described herein. Grounded shield 990 interconnects to ground contacts on memory 962. Grounded shield 990 includes mechanical features to interface with a connector that couples memory 962 to memory controller 964. The features secure the shielding in a non-permanent way, providing for a removable shield.

Device 900 includes processor 910, which performs the primary processing operations of device 900. Processor 910 can include one or more physical devices, such as microprocessors, application processors, microcontrollers, programmable logic devices, or other processing means. The processing operations performed by processor 910 include the execution of an operating platform or operating system on which applications and device functions are executed. The processing operations include operations related to I/O (input/output) with a human user or with other devices, operations related to power management, operations related to connecting device 900 to another device, or a combination. The processing operations can also include operations related to audio I/O, display I/O, or other interfacing, or a combination. Processor 910 can execute data stored in memory. Processor 910 can write or edit data stored in memory.

In one example, system 900 includes one or more sensors 912. Sensors 912 represent embedded sensors or interfaces to external sensors, or a combination. Sensors 912 enable system 900 to monitor or detect one or more conditions of an environment or a device in which system 900 is implemented. Sensors 912 can include environmental sensors (such as temperature sensors, motion detectors, light detectors, cameras, chemical sensors (e.g., carbon monoxide, carbon dioxide, or other chemical sensors)), pressure sensors, accelerometers, gyroscopes, medical or physiology sensors (e.g., biosensors, heart rate monitors, or other sensors to detect physiological attributes), or other sensors, or a combination. Sensors 912 can also include sensors for biometric systems such as fingerprint recognition systems, face detection or recognition systems, or other systems that detect or recognize user features. Sensors 912 should be understood broadly, and not limiting on the many different types of sensors that could be implemented with system 900. In one example, one or more sensors 912 couples to processor 910 via a frontend circuit integrated with processor 910. In one example, one or more sensors 912 couples to processor 910 via another component of system 900.

In one example, device 900 includes audio subsystem 920, which represents hardware (e.g., audio hardware and audio circuits) and software (e.g., drivers, codecs) components associated with providing audio functions to the computing device. Audio functions can include speaker or headphone output, as well as microphone input. Devices for such functions can be integrated into device 900, or connected to device 900. In one example, a user interacts with device 900 by providing audio commands that are received and processed by processor 910.

Display subsystem 930 represents hardware (e.g., display devices) and software components (e.g., drivers) that provide a visual display for presentation to a user. In one example, the display includes tactile components or touch-screen elements for a user to interact with the computing device. Display subsystem 930 includes display interface 932, which includes the particular screen or hardware device used to provide a display to a user. In one example, display interface 932 includes logic separate from processor 910 (such as a graphics processor) to perform at least some processing related to the display. In one example, display subsystem 930 includes a touchscreen device that provides both output and input to a user. In one example, display subsystem 930 includes a high definition (HD) or ultra-high definition (UHD) display that provides an output to a user. In one example, display subsystem includes or drives a touchscreen display. In one example, display subsystem 930 generates display information based on data stored in memory or based on operations executed by processor 910 or both.

I/O controller 940 represents hardware devices and software components related to interaction with a user. I/O controller 940 can operate to manage hardware that is part of audio subsystem 920, or display subsystem 930, or both. Additionally, I/O controller 940 illustrates a connection point for additional devices that connect to device 900 through which a user might interact with the system. For example, devices that can be attached to device 900 might include microphone devices, speaker or stereo systems, video systems or other display device, keyboard or keypad devices, or other I/O devices for use with specific applications such as card readers or other devices.

As mentioned above, I/O controller 940 can interact with audio subsystem 920 or display subsystem 930 or both. For example, input through a microphone or other audio device can provide input or commands for one or more applications or functions of device 900. Additionally, audio output can be provided instead of or in addition to display output. In another example, if display subsystem includes a touchscreen, the display device also acts as an input device, which can be at least partially managed by I/O controller 940. There can also be additional buttons or switches on device 900 to provide I/O functions managed by I/O controller 940.

In one example, I/O controller 940 manages devices such as accelerometers, cameras, light sensors or other environmental sensors, gyroscopes, global positioning system (GPS), or other hardware that can be included in device 900, or sensors 912. The input can be part of direct user interaction, as well as providing environmental input to the system to influence its operations (such as filtering for noise, adjusting displays for brightness detection, applying a flash for a camera, or other features).

In one example, device 900 includes power management 950 that manages battery power usage, charging of the battery, and features related to power saving operation. Power management 950 manages power from power source 952, which provides power to the components of system 900. In one example, power source 952 includes an AC to DC (alternating current to direct current) adapter to plug into a wall outlet. Such AC power can be renewable energy (e.g., solar power, motion based power). In one example, power source 952 includes only DC power, which can be provided by a DC power source, such as an external AC to DC converter. In one example, power source 952 includes wireless charging hardware to charge via proximity to a charging field. In one example, power source 952 can include an internal battery or fuel cell source.

Memory subsystem 960 includes memory device(s) 962 for storing information in device 900. Memory subsystem 960 can include nonvolatile (state does not change if power to the memory device is interrupted) or volatile (state is indeterminate if power to the memory device is interrupted) memory devices, or a combination. Memory 960 can store application data, user data, music, photos, documents, or other data, as well as system data (whether long-term or temporary) related to the execution of the applications and functions of system 900. In one example, memory subsystem 960 includes memory controller 964 (which could also be considered part of the control of system 900, and could potentially be considered part of processor 910). Memory controller 964 includes a scheduler to generate and issue commands to control access to memory device 962.

Connectivity 970 includes hardware devices (e.g., wireless or wired connectors and communication hardware, or a combination of wired and wireless hardware) and software components (e.g., drivers, protocol stacks) to enable device 900 to communicate with external devices. The external device could be separate devices, such as other computing devices, wireless access points or base stations, as well as peripherals such as headsets, printers, or other devices. In one example, system 900 exchanges data with an external device for storage in memory or for display on a display device. The exchanged data can include data to be stored in memory, or data already stored in memory, to read, write, or edit data.

Connectivity 970 can include multiple different types of connectivity. To generalize, device 900 is illustrated with cellular connectivity 972 and wireless connectivity 974. Cellular connectivity 972 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 974 refers to wireless connectivity that is not cellular, and can include personal area networks (such as Bluetooth), local area networks (such as WiFi), or wide area networks (such as WiMax), or other wireless communication, or a combination. Wireless communication refers to transfer of data through the use of modulated electromagnetic radiation through a non-solid medium. Wired communication occurs through a solid communication medium.

Peripheral connections 980 include hardware interfaces and connectors, as well as software components (e.g., drivers, protocol stacks) to make peripheral connections. It will be understood that device 900 could both be a peripheral device ("to" 982) to other computing devices, as well as have peripheral devices ("from" 984) connected to it. Device 900 commonly has a "docking" connector to connect to other computing devices for purposes such as managing (e.g., downloading, uploading, changing, synchronizing) content on device 900. Additionally, a docking connector can allow device 900 to connect to certain peripherals that allow device 900 to control content output, for example, to audiovisual or other systems.

In addition to a proprietary docking connector or other proprietary connection hardware, device 900 can make peripheral connections 980 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), or other type.

In general with respect to the descriptions herein, in one example, an apparatus includes: a printed circuit board (PCB) including a component that generates high frequency electromagnetic frequency (EMF) noise during operation, the PCB including pads to interface with a corresponding connector; and a removable shield to cover the component, the shield including a gap in a perimeter of the shield to align with clips in the corresponding connector to secure the shield with the PCB, and the shield including lock fingers to extend from an edge of the shield to interface with the corresponding connector to align the shield with the corresponding connector.

In one example, the shield is to be secured in contact with the PCB via the clips in the corresponding connector. In one example, the PCB includes multiple grounding pads to contact to the removable shield when secured. In one example, the grounding pads comprise flat pads on the PCB to interface with a punched surface of the shield. In one example, the grounding pads comprise protruding pads on the PCB to interface with a flat shield surface. In one example, the grounding pads comprise pads to a ground plane of the PCB, wherein the shield connects to a system ground only indirectly through the grounding pads and the corresponding connector. In one example, the shield includes a flange to interface with the clips to secure to the PCB, wherein the gap in the perimeter comprises a gap in the flange to align with the clips of the corresponding connector. In one example, the shield includes a side wall to completely surround the component on the PCB. In one example, the component comprises a dynamic random access memory (DRAM) device. In one example, the PCB comprises a PCB of a dual inline memory module (DIMM).

In general with respect to the descriptions herein, in one example, a computing device includes: a processor; and a memory printed circuit board (PCB) coupled to the processor, the PCB including memory devices that generate high frequency electromagnetic frequency (EMF) noise during operation, the PCB including pads to interface with a corresponding connector; a removable shield to cover the memory devices, the shield including a gap in a perimeter of the shield to align with clips in the corresponding connector to secure the shield with the PCB, and the shield including lock fingers to extend from an edge of the shield to interface with the corresponding connector to align the shield with the corresponding connector.

In one example, the shield is to be secured in contact with the PCB via the clips in the corresponding connector. In one example, the PCB includes multiple grounding pads to contact to the removable shield when secured. In one example, the grounding pads comprise flat pads on the PCB to interface with a punched surface of the shield. In one example, the grounding pads comprise protruding pads on the PCB to interface with a flat shield surface. In one example, the grounding pads comprise pads to a ground plane of the PCB, wherein the shield connects to a system ground only indirectly through the grounding pads and the corresponding connector. In one example, the shield includes a flange to interface with the clips to secure to the PCB, wherein the gap in the perimeter comprises a gap in the flange to align with the clips of the corresponding connector. In one example, the shield includes a side wall to completely surround the component on the PCB. In one example, the PCB comprises a PCB of a dual inline memory module (DIMM), wherein the component comprises one of multiple dynamic random access memory (DRAM) devices mounted on the DIMM. In one example, the host processor device includes a multi-core processor. In one example, the system further includes a display communicatively coupled to host processor. In one example, the system further includes a network interface communicatively coupled to host processor. In one example, the system further includes a battery to power the computing device.

Flow diagrams as illustrated herein provide examples of sequences of various process actions. The flow diagrams can indicate operations to be executed by a software or firmware routine, as well as physical operations. A flow diagram can illustrate an example of the implementation of states of a finite state machine (FSM), which can be implemented in hardware and/or software. Although shown in a particular sequence or order, unless otherwise specified, the order of the actions can be modified. Thus, the illustrated diagrams should be understood only as examples, and the process can be performed in a different order, and some actions can be performed in parallel. Additionally, one or more actions can be omitted; thus, not all implementations will perform all actions.

To the extent various operations or functions are described herein, they can be described or defined as software code, instructions, configuration, and/or data. The content can be directly executable ("object" or "executable" form), source code, or difference code ("delta" or "patch" code). The software content of what is described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to what is disclosed and implementations of the invention without departing from their scope. Therefore, the illustrations and examples herein should be construed in an illustrative, and not a restrictive sense. The scope of the invention should be measured solely by reference to the claims that follow.

What is claimed is:
1. An apparatus, comprising:
 a printed circuit board (PCB) including a component mounted on a surface of the PCB that generates high frequency electromagnetic frequency (EMF) noise during operation, the PCB including signal pads at one edge of the PCB to interface with a corresponding connector, and including multiple grounding pads along a perimeter of the surface having the component mounted; and a removable shield to cover the component, the shield including a gap in a perimeter of the shield to align with clips in the corresponding connector, the clips in the corresponding connector to align the PCB to the corresponding connector and to secure the shield with the PCB, including to cause the shield to contact the multiple grounding pads of the surface of the PCB, and the shield including lock fingers to extend from an edge of the shield that aligns with the one edge of the PCB, the lock fingers to extend into the corresponding connector to interface with the corresponding connector to align the shield with the corresponding connector.

2. The apparatus of claim 1, wherein the grounding pads comprise flat pads on the PCB to interface with a punched surface of the shield.

3. The apparatus of claim 1, wherein the grounding pads comprise protruding pads on the PCB to interface with a flat shield surface.

4. The apparatus of claim 1, wherein the grounding pads comprise pads to a ground plane of the PCB, wherein the shield connects to a system ground only indirectly through the grounding pads and the corresponding connector.

5. The apparatus of claim 1, wherein the shield includes a flange to interface with the clips to secure to the PCB, wherein the gap in the perimeter comprises a gap in the flange to align with the clips of the corresponding connector.

6. The apparatus of claim 1, wherein the shield includes a side wall to completely surround the component on the PCB.

7. The apparatus of claim 1, wherein the component comprises a dynamic random access memory (DRAM) device.

8. The apparatus of claim 7, wherein the PCB comprises a PCB of a dual inline memory module (DIMM).

9. The apparatus of claim 1, wherein the multiple grounding pads have a spacing approximately equal to one-tenth a center frequency of the EMF noise generated during operation of the component.

10. A computing device, comprising:
a processor;
a memory printed circuit board (PCB) coupled to the processor, the PCB including memory devices mounted on a surface of the PCB that generate high frequency electromagnetic frequency (EMF) noise during operation, the PCB including signal pads at one edge of the PCB to interface with a corresponding connector, and including multiple grounding pads along a perimeter of the surface having the memory devices mounted; and a removable shield to cover the memory devices, the shield including a gap in a perimeter of the shield to align with clips in the corresponding connector, the clips in the corresponding connector to align the PCB to the corresponding connector and to secure the shield with the PCB, including to cause the shield to contact the multiple grounding pads of the surface of the PCB, and the shield including lock fingers to extend from an edge of the shield that aligns with the one edge of the PCB, the lock fingers to extend into the corresponding connector to interface with the corresponding connector to align the shield with the corresponding connector.

11. The computing device of claim 10, wherein the grounding pads comprise flat pads on the PCB to interface with a punched surface of the shield.

12. The computing device of claim 10, wherein the grounding pads comprise protruding pads on the PCB to interface with a flat shield surface.

13. The computing device of claim 10, wherein the grounding pads comprise pads to a ground plane of the PCB, wherein the shield connects to a system ground only indirectly through the grounding pads and the corresponding connector.

14. The computing device of claim 10, wherein the shield includes a flange to interface with the clips to secure to the PCB, wherein the gap in the perimeter comprises a gap in the flange to align with the clips of the corresponding connector.

15. The computing device of claim 10, wherein the shield includes a side wall to completely surround the memory devices.

16. The computing device of claim 10, wherein the PCB comprises a PCB of a dual inline memory module (DIMM), wherein the memory devices comprise dynamic random access memory (DRAM) devices mounted on the DIMM.

17. The computing device of claim 10,
wherein the processor includes a multi-core processor;
further comprising a display communicatively coupled to the processor;
further comprising a network interface communicatively coupled to the processor; or
further comprising a battery to power the computing device.

18. The computing device of claim 10, wherein the multiple grounding pads have a spacing approximately equal to one-tenth a center frequency of the EMF noise generated during operation of the memory devices.

* * * * *